United States Patent [19]

Zibis et al.

[11] Patent Number: 4,803,448
[45] Date of Patent: Feb. 7, 1989

[54] CANTILEVER MOUNT OF A SUBSTRATE LAMINA OF A SURFACE WAVE DEVICE

[75] Inventors: Peter Zibis; Wolfgang Pahl, both of Munich, Fed. Rep. of Germany

[73] Assignee: Siemens Aktiengesellschaft, Berlin and Munich, Fed. Rep. of Germany

[21] Appl. No.: 133,235

[22] Filed: Dec. 14, 1987

Related U.S. Application Data

[63] Continuation of Ser. No. 937,416, Dec. 3, 1986, abandoned.

[30] Foreign Application Priority Data

Dec. 5, 1985 [DE] Fed. Rep. of Germany ....... 3543079
Feb. 26, 1986 [DE] Fed. Rep. of Germany ....... 3606214

[51] Int. Cl.⁴ .................... H03H 9/145; H03H 9/25; H03H 9/64
[52] U.S. Cl. ................ 333/151; 310/313 D; 333/153; 333/194; 333/195
[58] Field of Search ............... 333/150–155, 333/193–196; 310/313 R, 313 A, 313 B, 313 C, 313 D

[56] References Cited

U.S. PATENT DOCUMENTS

| | | | |
|---|---|---|---|
| 3,753,164 | 8/1973 | DeVries | 333/153 |
| 3,983,514 | 9/1976 | Coussot | 333/151 |
| 4,450,420 | 5/1984 | Buckinx | 333/1984 |
| 4,533,885 | 8/1985 | Higgins, Jr. | 333/191 |

FOREIGN PATENT DOCUMENTS 0013818 2/1981 Japan .................................. 333/151
0178812 10/1984 Japan .................................. 333/193

OTHER PUBLICATIONS

1983 Ultrasonics Symposium "Stressed Saw Mono or Dual Oscillator Stability" by Meunier and Hartemann pp. 267-270.
Patents Abstracts of Japan E-255, Jul. 12, 1984, vol. 8, No. 149.
Patents Abstracts of Japan E-207 (published Japanese Application 58-13 30 21 of 8 Aug. 1983).
Patents Abstracts of Japan E-247/2, May 29, 1984 vol. 8, No. 115.
Electronics Letters 25 Nov. 1982 vol. 18, pp. 1030/1031.

Primary Examiner—Marvin L. Nussbaum
Attorney, Agent, or Firm—Hill, Van Santen, Steadman & Simpson

[57] ABSTRACT

A cantilever mount for a substrate lamina of a surface wave device wherein the substrate lamina 42 of the component is attached only at its one end 45 and is a wedge-shaped structure. The tapered end 46 of the substrate lamina 42 which is remote from the atachment location is mounted above the surface 41 of the base plate 41 which causes minimization of disturbing influences.

20 Claims, 1 Drawing Sheet

U.S. Patent  Feb. 7, 1989  4,803,448
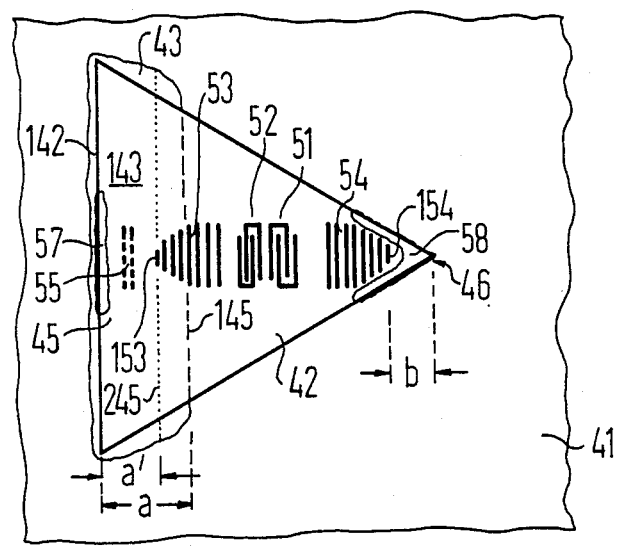
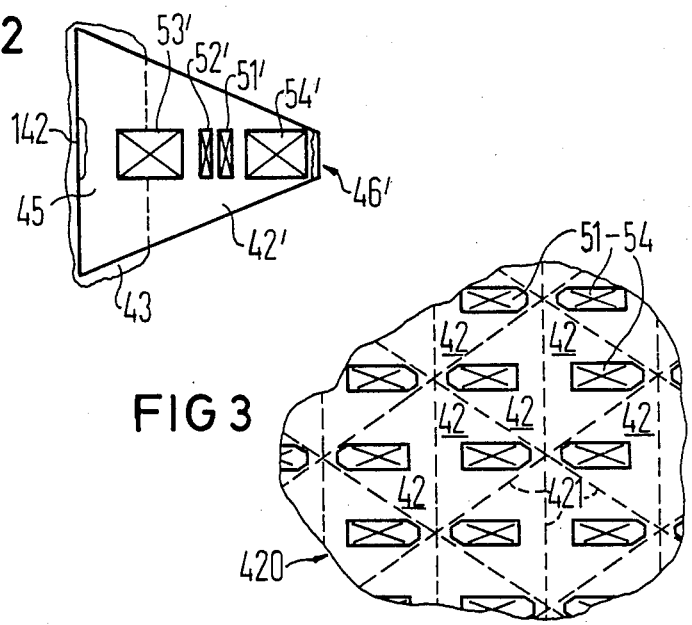

CANTILEVER MOUNT OF A SUBSTRATE LAMINA OF A SURFACE WAVE DEVICE

This is a continuation of application Ser. No. 937,416, filed Dec. 3, 1986, now abandoned.

BACKGROUND OF THE INVENTION

1. Field of the Invention

This invention relates in general to a cantilever mount of a substrate lamina of a surface wave device wherein the device may be generally triangular shaped and is attached to a base along one edge thereof and wherein its point which extends from said edge of attachment is mounted above the base so that it can freely move.

2. Description of the Prior Art

Surface wave components are known which may be filters, resonators and/or delay lines. The significant features of such components comprise a transducer and/or reflector structures which are arranged on the surface of the substrate plate so as to essentially define the prescribed properties of the component. The structures may be strip-shaped finger electrodes and/or reflector strips attached to the surface as well as auxiliary structures such as pads, or shielding electrodes. Electrically, non-conducting etched structures of the substrate surface are also standard for reflector structures instead of metallic strips.

Such a substrate lamina of, preferably, quartz, lithiumniobat, lithiumtantalat and the like is normally held on a support and is accommodated in a housing, where an adhesive means is provided for mounting and is arranged between the back surface of the substrate lamina on the opposite side of the wave components and the support. Generally, the adhesive extends over the entire surface of the back surface of the substrate lamina so as to provide a tight attachment of the substrate lamina to the support.

An adhesive means which is relatively plastic is the preferred means of attaching such lamina to a support so that the stresses occurring due to temperature changes for example, in the support are isolated from the substrate lamina. Gaseous discharge from such a viscous adhesive combined with the corresponding precipitate on the substrate surface of the substrate lamina carrying the structures have been assumed as the reasons that disturbances occur which have occurred in the past, but these cannot be eliminated using glues having less solvent or less softener and which are harder have also been employed.

Disturbances occur to a noticeable degree particularly in narrow band filters and resonator components and/or delay lines where the disturbances are based on mechanical movement which originate from housing parts, for example.

U.S. Pat. Nos. 3,753,164 and 4,450,420 disclose surface wave filters having trapezoidal or triangular-shaped substrate lamina. The shapes selected serve the purpose for reducing reflections and of saving substrate material. The employment of a substrate body having a triangular shape is known from the publication 1983 Ultrasonics Symposium, page 268, FIG. 4. This article discloses a dynamometer having a surface wave structure mounted on the surface of the substrate body. This structure supplies the output measured variable. The surface wave structure is at least substantially placed therein as shown in FIG. 4 close to the edge of the three-sided substrate body where the substrate body is held. The point lying opposite the mounting is largely free of a structure.

European Patent Application Publication No. 0 156 502 discloses a surface wave arrangement having a rhombic shape. The rhombus is held in its middle region which is where the main part or the defining part of the surface wave structure is located. "Defining part" is defined as those parts of the transducers and/or reflector structure which significantly define the prescribed properties of the surface wave device. The central position of such a structure thus determines a certain limiting region from which the defining properties of the structure greatly diminish relative to the center of the structure toward the end which is held.

SUMMARY OF THE INVENTION

The present invention provides a cantilever mounting means of the substrate lamina of a surface wave component which may be a narrow band frequency precise filter or a resonator or a delay line wherein the substrate lamina is mounted on a base with an adhesive between the substrate lamina and the base and whereby the transducer and/or reflector structures mounted on the substrate surface which significantly define the properties of the component are arranged such that the substrate lamina is tapered with respect to its surface so that the substrate lamina has a broad first end and a narrow opposite end and adhesive means is located only in the region of the first end of the substrate lamina and only extends maximally up to about the middle position of the defining structure lying closest to the first end on the substrate surface and wherein the second end of the lamina is free floating so that mechanical distortions of the material of the substrate lamina which could act on the substrate lamina in the regions of the structures mounted on the surface are minimized.

The acute or obtuse conical substrate lamina used in the invention are held at its broad first end which does not extend further than at most up to the central position of the first defining structure and is held for example, with an adhesive. According to the invention, the significant parts of the overall surface wave structure of the component extend over the region of the opposite end of the wedge-shaped substrate lamina even though the substrate lamina is inherently extremely sensitive to flexations in the region of this end of the "wedge". With surface wave component having this selected shape and with placement of the transducer structures in the region of the end opposite to the support mounting, the flexations of the substrate lamina which are anticipated on the basis of a merely single sided mounting surprisingly have little disturbing effect on the properties of the component of the invention. The invention allows surface wave components mounted on substrate lamina to be produced which have minimum disturbances and much less than those of the prior art devices.

A preferred shape of the substrate lamina of the invention for a surface wave component is that of a wedge having a surface which is shaped as an equalateral triangle having acute angles of 60°. One side of the triangle is a first end and extending from this first end which is attached to the base, the substrate lamina extends cantileverly up to its opposite second end which is one of the apexes of the triangle. The surface wave structure is mounted along the longitudinal extent and extends as far as possible into this apex which is the region which is as far as possible from the mounting point.

Other objects, features and advantages of the invention will be readily apparent from the following description of certain preferred embodiments thereof taken in conjunction with the accompanying drawings although variations and modifications may be affected without departing from the spirit and scope of the novel concepts of the disclosure and in which:

BRIEF DESCRIPTION OF THE DRAWINGS

FIG. 1 is a plan view of a preferred embodiment of the invention;

FIG. 2 illustrates in plan view a modified form of the invention; and

FIG. 3 is a schematic view showing how a plurality of components according to the invention of embodiment of FIG. 1 can be manufactured.

DESCRIPTION OF THE PREFERRED EMBODIMENTS

FIG. 1 illustrates a substrate lamina 42 in plan view mounted on a base 41. The thickness of the substrate lamina 42 is uniform throughout its area. The substrate lamina 42 may be composed of, for example, lithiumniobate or lithiumtantalate. The plan surface shape of the substrate lamina 42 is for example, an equilateral triangle as shown.

Two interdigital structures such as 51 and 52 are formed on the substrate lamina 42 and can be employed as input and output transducers of the components. Associated reflector structures 53 and 54 are also formed on the substrate lamina 42. The structures 51, 52, 53 and 54 are arranged in line as shown.

As can be seen from FIG. 1 the structures 51, 52, 53 and 54 extend far into the right-hand apex and far into the end 46 of the substrate lamina 42. In particular, the reflector structure 54 is formed of strips or, respectively, fingers which become shorter toward the last finger 154 to accommodate the reduction in the width of the substrate lamina 42. A corresponding shortening of the fingers of the reflector structure 53 is also preferably provided so that the last finger 153 of the reflector structure 53 is also relatively short.

The substrate lamina 42 is mounted on a base or foundation 41 of which only the contours are shown in the form of broken edges. The base or foundation 41 is mounted in a housing (not shown) together with the substrate lamina 42.

As previously discussed, the substrate lamina 42 41 is attached to the base 41 at only one first end 45. The first end 45 is the neighboring region of the triangular edge 145 of the substrate lamina 42. Joining means such as an adhesive are used for mounting the substrate lamina 42 to the foundation 41 at its first end 45. The adhesive 43 is mounted between the underside of the substrate lamina 42 and the upper side of the base 41 is indicated in the drawing. The thickness of this layer of adhesive 43 mounted between the substrate lamina 42 and the base 41 is selected to have a dimension such that the entire substrate 42 floats free or projects freely above the foundation 41 with a substantial portion outside of the region 143 of the adhesive 43. The position of the boundary 145 of the adhesive 43 is important since its position relative to the reflector structure 53 is significant. The boundary 145 on the underside substrate lamina 42 can extend into the region or, respectively, up to the defined middle position of the reflector structure 53.

The structures 51, 52, 53 and 54 and particularly the reflector structures 53 and 54 are structures which significantly define the properties of the components. For example, they define the resonant frequency, the band width and other characteristics of a filter. However, generally the conditions of those parts of the reflector structure 53 and the reflector structure 54 lying further toward the outside as seen from the center of the structures 51–54 are less important and their effect diminishes at the outer edge as far as changing the defining properties. Thus, for example, that part of the reflector structure 53 comprising the last finger 153 lying to the left of the boundary 145 in FIG. 1 determines the properties of the entire filter only to a very small degree. In a corresponding manner, the reflector structure 54 may also be designed with fingers having lengths which decrease toward the second end 46 of the substrate lamina 42.

In the invention, the structure substantially defining the properties of the component are placed on the substrate lamina with an asymmetrical arrangement on the surface of the substrate.

As an example, an adhesive which is referred to as hard glue is employed as the adhesive 43. Pre-cross-linked epoxy resins and polyimides are particularly suitable as the adhesive 43. It is beneficial to use an adhesive which does not flow very much. However, other means of attachment such, as for example, glass solder, bonding, alloying and other attachment means can also be employed to join the substrate lamina 42 to the base 41. For this purpose, layers, preferably layers of metal, are applied to the substrate lamina 42 and/or to the base 41 before joining and are placed in the region 143 provided for the adhesive 43 for the mounting of the first end 45 of the substrate lamina 42. The attachment can be effected with this layer or these layers. Expediently, the connection is also a hard connection in the present invention. With the dimensions of the invention such as shown in FIG. 1, it is not only achieved that the flections of the foundation 41 coming from the housing such as particularly temperature change flections cannot effect the prescribed properties of the component, but it is also achieved that jaring concussions to the component do not exert any disturbing influences due to the single side mounting even though the structures 51 through 54 are mounted on the substrate lamina 42 in a region which can flex.

Dampening compounds 57 and 58 of a standard type are also mounted between the lamina 42 and the base 41.

A finger structure located in the region 143 of the attaching means 43 is schematically indicated by 55. The structure 55, however, is a non-defining structure for the properties of the component. Such structure 55 can, for example, be a further output transducer for a control signal and has no effect on the property defining structures 51 through 54.

It is possible that the substrate lamina 42 may lightly lie against the surface of the base 41. Preferably, however, a small distance and an air gap is provided between the substrate lamina 42 and the foundation 41. In particular, the damping compound 58 should not cause an attachment to the foundation 41 which opposes the objects of the invention.

FIG. 1 illustrates dimension a and a' between the edge 142 and the last finger 153 of the structure 53 and these dimensions are noticeably greater than the dimension b between the last finger 154 of the structure 54 and the apex 46 of the substrate lamina 42. This enables a firm mounting of the substrate lamina 42 by means of, for example, the adhesive 43 on the foundation 41.

As stated above, the edge 145 can maximally extend up to the middle position of the structure 53 as indicated by the dashed line in FIG. 1. The dotted line 245 indicates a position of the edge of the adhesive 43 which is also according to the invention. Which exact position of the edge between 145 and 245 is selected does not effect the invention. A shortening of the length a to a' reduces the width of the region 143 of the mounting means. In this manner, the increasing of the length a up to the boundary 145 offers advantages without significantly reducing the properties of isolating the lamina 42 from disturbing influences.

The substrate lamina 42 according to the invention may have the following dimensions such as, for example, the length between the edge 142 and the end 46 may be 6 mm and the length a may be 0.5 through 1 mm. The air gap between the bottom surface of the lamina 42 and the foundation 41 may be in the range from a micron to a few tenths of a millimeter.

FIG. 2 illustrates another example of the invention wherein the substrate lamina 42' is formed in the shape of a truncated wedge which has its apex end 46 cut off at its second end. The other arrangements are substantially as shown in FIG. 1.

FIG. 3 illustrates a portion of a substrate plate 420 comprising a plurality of substrate lamina 42 on which the structures 51 through 54 are merely suggested. The dashed lines extending diagonally and vertically and illustrate the cuts that are made so as to form the individual substrate lamina 42 illustrated in FIG. 1.

Although the invention has been described with respect to preferred embodiments, it is not to be so limited as changes and modifications can be made which are within the full intended scope of the invention as defined by the appended claims.

We claim as our invention:

1. A mounting means for a substrate lamina of a surface wave component, said substrate lamina includes a transducer structure and at least one reflector structure and is mounted on a foundation, means for joining said substrate lamina and said foundation, whereby at least one of the reflector structures mounted on the substrate being a defining structure defining prescribed properties of the component comprising, said substrate lamina (42) has a tapered shape so that the substrate lamina has a broad, first end (45) and an opposite, second end (46) which is narrower than said first end, said joining means (43) located only in the region (143) of said first end (45) of said substrate lamina (42) and said joining means extending maximally only up to about the middle position (145) of this defining reflector structure (53) which is positioned closest to said first end on said substrate surface; said second end (46) being free-floating relative to said foundation, so that mechanical distortions of the material of said substrate lamina (42) which could act on the substrate lamina in the region of said transducer and reflector structure mounted on said substrate surface are minimized.

2. A mounting means according to claim 1 wherein said substrate lamina (42) has the shape of a triangle and said broad first end is the base of said triangle and said second end is the apex of said triangle and the said triangle is an equilateral triangle.

3. A mounting means according to claim 1 wherein said substrate lamina (42') has the shape of a truncated wedge.

4. A mounting means according to claims 1 or 2 or 3, wherein said means for joining said substrate lamina and said foundation extends only up to an end (153) of said defining reflector structure (53) which end (153) and which structure (53) is closest to said first end of said substrate lamina.

5. A mounting means according to claims 1, 2 or 3 wherein said transducer and reflector structures (51 through 54) extend up to the apex (46) of said substrate lamina (42).

6. A mounting means according to claims 1, 2 or 3, wherein a slight air gap is maintained between the opposite surfaces of said substrate lamina (42) and said foundation (41).

7. A mounting means according to claims 1, 2 or 3, wherein said joining means (43) is an adhesive.

8. A mounting means according to claims 1, 2, or 3, wherein said joining means (43) is a glass solder.

9. A mounting means according to claims 1, 2 or 3 wherein said joining means (43) is a metallic bonding layer.

10. A mounting means according to claims 1, 2, or 3, wherein said joining means (43) are alloyable metal layers.

11. A mounting of means for a substrate lamina of a surface wave component, said substrate lamina includes a transducer and is mounted on a foundation, and at least one transducer structure is always present, means for joining said substrate lamina and said foundation, whereby at least one of the structures mounted on the substrate being a defining structure defining prescribed properties of the component comprising, said substrate lamina (42) has a tapered shape so that the substrate lamina has a broad, first end (45) and an opposite, second end (46) which a narrower than said first end, said joining means (43) located only in the region (143) of said first end (45) of said substrate lamina (42) and said joining means extending maximally only up to about the middle position (145) of a defining structure (53) which is positioned closest to said first end on said substrate surface; said defining structure (53) generally being positioned outside the area of said joining means (43); said second end (46) being free-floating relative to said foundation, so that mechanical distortions of the material of said substrate lamina (42) which could act on the substrate lamina on the region of said transducer structures mounted on said substrate surface are minimized.

12. A mounting means according to claim 11 wherein said substrate lamina (42) has the shape of a triangle and said broad first end is the base of said triangle and said second end is the apex of said triangle and said triangle is an equilateral triangle.

13. A mounting means according to claim 11 wherein said substrate lamina (42') has the shape of an obtuse wedge.

14. A mounting means according to claims 12 or 13 or 14, wherein said means (43) for joining said substrate lamina and said foundation extends only up to an end (153) of said defining structure (53) which is the defining structure being positioned closest to said first end of said substrate lamina.

15. A mounting means according to claims 11, 12 or 13 wherein said transducer and reflector structures (51 through 54) extend up to the apex (46) of said substrate lamina (42).

16. A mounting means according to claims 11, 12 or 13, wherein a slight air gap is maintained between the opposite surfaces of said substrate lamina (42) and said foundation (41).

17. A mounting means according to claims 11, 12 or 13, wherein said joining means (43) is an adhesive.

18. A mounting means according to claims 11, 12, or 13, wherein said joining means (43) is a glass solder.

19. A mounting means according to claims 11, 12 or 13 wherein said joining means (43) is a metallic bonding layer.

20. A mounting means according to claims 11, 12 or 13, wherein said joining means (43) are alloyable metal layers.

* * * * *